United States Patent
Meserve

(10) Patent No.: US 6,199,266 B1
(45) Date of Patent: Mar. 13, 2001

(54) METHOD FOR PRODUCING SUPERCONDUCTING CABLE AND CABLE PRODUCED THEREBY

(75) Inventor: Robert F. Meserve, Lisbon, NH (US)

(73) Assignee: New England Electric Wire Corporation, Lisbon, NH (US)

( * ) Notice: Subject to any disclaimer, the term of this patent is extended or adjusted under 35 U.S.C. 154(b) by 0 days.

(21) Appl. No.: 08/226,010

(22) Filed: Apr. 11, 1994

(51) Int. Cl.[7] .................................................. H01L 39/24
(52) U.S. Cl. ........................ 29/599; 174/125.1; 505/919; 505/930
(58) Field of Search ........................... 174/125.1; 29/599; 505/230, 821, 887, 917, 918, 919, 921, 930

(56) References Cited

U.S. PATENT DOCUMENTS

| | | | |
|---|---|---|---|
| 1,509,102 | 9/1924 | Dana | 174/119 C X |
| 3,662,093 | 5/1972 | Wilson et al. | 174/125.1 |
| 3,683,103 | 8/1972 | Mancino | 174/119 C |
| 3,710,000 | 1/1973 | Shattes et al. | 174/125.1 |
| 4,329,539 | 5/1982 | Tanaka et al. | 174/125.1 |
| 4,785,142 | 11/1988 | Smith, Jr. et al. | 174/15.5 |
| 4,835,340 | 5/1989 | Muz | 174/119 R |

FOREIGN PATENT DOCUMENTS

2067156 * 3/1987 (JP) ..................................... 505/918

OTHER PUBLICATIONS

T. Scott Kreilick, Niobium–Titanium Superconductors, Metals Handbooks vol. 2, 10th edition, Properties and Selection, pp. 1043–1058, Oct. 1990.*

* cited by examiner

*Primary Examiner*—Hyung-Sub Sough
(74) *Attorney, Agent, or Firm*—Pepe & Hazard LLP

(57) ABSTRACT

A superconductor cable with high interstrand resistance is produced from superconductor wire strands which has been electroplated with nickel. The wire strands have filaments of a superconductor alloy in a normally conducting metal matrix and are electroplated before they are formed into an elongated bundle of generally circular cross section. This bundle is then deformed and compacted into a superconductor cable of generally polygonal cross section which is usually trapezoidal. The superconductor wire is preferably comprised of a multiplicity of filaments of niobium/titanium superconductor alloy disposed within a matrix of copper.

7 Claims, 3 Drawing Sheets

METHOD FOR PRODUCING SUPERCONDUCTING CABLE AND CABLE PRODUCED THEREBY

BACKGROUND OF THE INVENTION

The present invention relates to superconductor cables, and more particularly, to superconducting cables having controlled interstrand resistance.

The most common application for superconducting cables is in the manufacture of electromagnets, but this use encounters a significant problem as a result of eddy currents generated within the cable and their deleterious effects produced on magnetic fields and on critical currents. As field strength increases, lateral voltages are generated in the cable which produce eddy current loops extending laterally through normally conducting layers from one superconducting strand to the next. It is these eddy currents which impair performance of the superconductor.

Superconductors fabricated of strands of niobium/titanium filaments in a copper matrix and overall copper jacket are known in the art. When these conductors are used in compacted cables for AC magnet applications, it has been found that the heat and pressure used in fabrication frequently causes the strands to have low electrical resistance to one another, thereby adversely affecting the magnet's AC loss characteristics.

One of the first attempts to solve this problem was to replace the outer copper shell of the wire strands with a more resistive material such as a copper/nickel alloy. Although some strand decoupling was achieved, the disadvantages were numerous and included: difficulty and expense in fabrication, restrictions in the copper-to-superconductor ratio, and a limited and fixed value for the amount of decoupling which could be achieved.

Coating the superconductor strands with a semiconductive material is currently the most accepted method of obtaining the desired interstrand resistance. One material that has been extensively used to date is a tin/silver alloy applied by a hot dip process involving passage of wire through a bath of the molten alloy; one type is sold by Tory Corporation under the trademark Staybrite®. However, this material has some limitations. For example, the tin/silver coatings do not provide the required amount of interstrand resistance in many instances. A typical value of $R_I$ between strands obtained is 2 microhms. Additionally, if the coating process is not performed carefully, the superconducting properties of the wire may be adversely affected due to overheating. Further, the coating thickness is not well controlled in this process and can vary from 10 to over 100 microinches over the course of a run. The low softening temperature of tin/silver is also a problem when curing some of the higher temperature insulation systems used on these cables. The soft surface coating can flake off and interfere with the extremely precise dimensional measurement of the cable made just after it is formed.

The most favored material used to date to provide the required interstrand resistance is black copper oxide; one type is sold by Enthone Corporation under the trademark Ebonol C®. This material is applied by running copper-clad superconducting wire through an oxidizing agent to form a coating of cupric oxide on the surface. Recent tests, however, have shown that values of $R_I$ between strands can vary from 10,000 microhms to as much as 2 ohms and also appear to be nonlinear with applied current. Further, a copper oxide coating is an extremely difficult and expensive coating to provide, and the chemicals involved are corrosive and must be treated as a hazardous waste. The coating thickness is not well controlled which probably contributes to the nonlinearity in strand to strand resistance $R_I$. A further concern is that the coating itself is abrasive and quite powdery which causes a number of difficult problems in manufacturing and measuring the compacted cables.

It is an object of the present invention to provide a novel method for making a superconductor cable with high interstrand resistance to control eddy current losses.

It is also an object to provide such a superconductor cable which may be processed at high temperatures and pressures.

Another object is to provide such a superconductor cable which will have substantially consistent and stable interstrand resistance generally linear with current flow through the cable.

A further object is to provide such a superconductor cable which may be fabricated readily and economically using known processes.

SUMMARY OF THE INVENTION

It has now been found that the foregoing and related objectives may be readily attained in a method for making superconductor cable which includes electroplating a superconductor wire having filaments of a superconductor alloy in a normally conducting metal matrix to provide a nickel coating thereon. An elongated bundle of generally circular cross section is formed from a multiplicity of strands of the electroplated wire, and the bundle is deformed and compacted into a superconductor cable of generally polygonal cross section. The resultant cable exhibits relatively high interstrand resistance.

Generally, the superconductor wire is comprised of a multiplicity of filaments of a superconductor alloy disposed within a matrix of copper, and desirably the superconductor alloy is niobium/titanium. The method may include the initial steps of cladding rods of the superconductor alloy with copper, drawing the clad rods to a reduced diameter, placing multiple lengths of the drawn rods in a copper tube, and drawing the tube containing the rods into the superconductor wire which is to be plated.

Preferably, the thickness of the nickel coating is about 40–60 microinches and is developed by passing the wire through a cleaning solution, rinsing the cleaning solution from the wire and passing the cleaned and rinsed wire through an acid etching bath. The etched wire is then passed through a nickel electroplating bath, and the nickel electroplated wire is rinsed.

Desirably, the deformation step is effected by passing the bundle through a rolling die assembly to effect compaction and deformation of the wire strands while substantially maintaining the integrity of the nickel coating on the strands.

The resultant superconductor cable has high interstrand resistance, and the cable comprises a multiplicity of strands of superconducting wire each having a coating of nickel thereon, which is of generally uniform thickness.

DETAILED DESCRIPTION OF THE PREFERRED EMBODIMENTS

Figure 1:
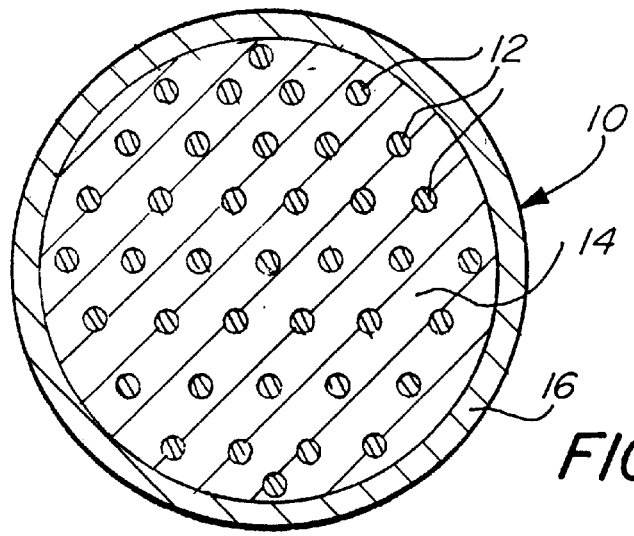
FIG. 1 is a cross sectional, partially diagrammatic view of a wire strand utilized to form the superconductor cable of the present invention with the components exaggerated in size.

Turning first to FIG. 1, therein illustrated a superconductor wire strand 10 comprised of filaments 12 of superconductor alloy disposed in a copper matrix 14, and the strand has an electrodeposited outer layer 16 of nickel. The thicknesses of the several components are exaggerated for purposes of illustration.

Figure 2:
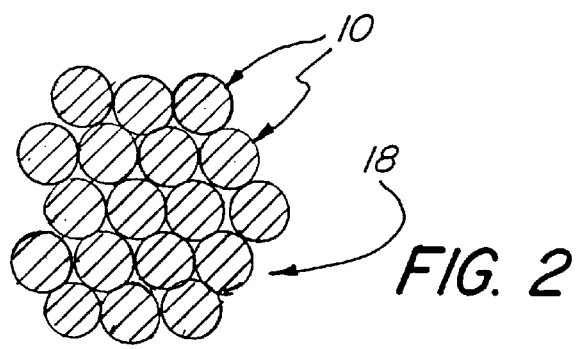
FIG. 2 is a cross sectional, partially diagrammatic view of a cable bundle produced from the wire strands of FIG. 1.
Figure 3:
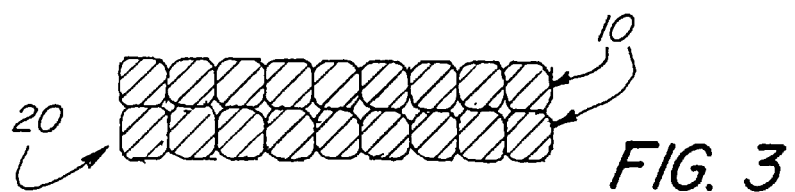
FIG. 3 is a similar view of the cable produced by compaction and deformation of the bundle of FIG. 2.
Figure 4:
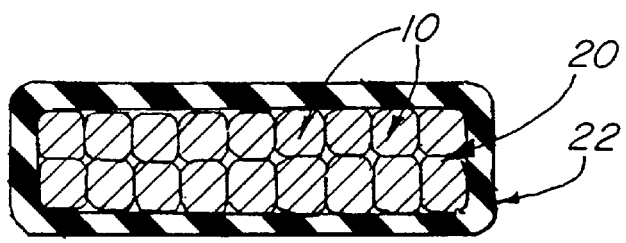
FIG. 4 is a view of the cable of FIG. 3 after it has been provided with an insulating coating.

A multiplicity of such strands 10 are wound together to produce a bundle 18 of generally circular cross section as seen in FIG. 2, and this bundle 18 is then passed through a die assembly to compact and deform the strands 10 of the bundle 18 so that there is produced a cable 20 of generally rectangular cross section as seen in FIG. 3. Subsequently, this cable 20 is wrapped with a polymer tape to provide an insulating jacket 22 as seen in FIG. 4.

Figure 6:
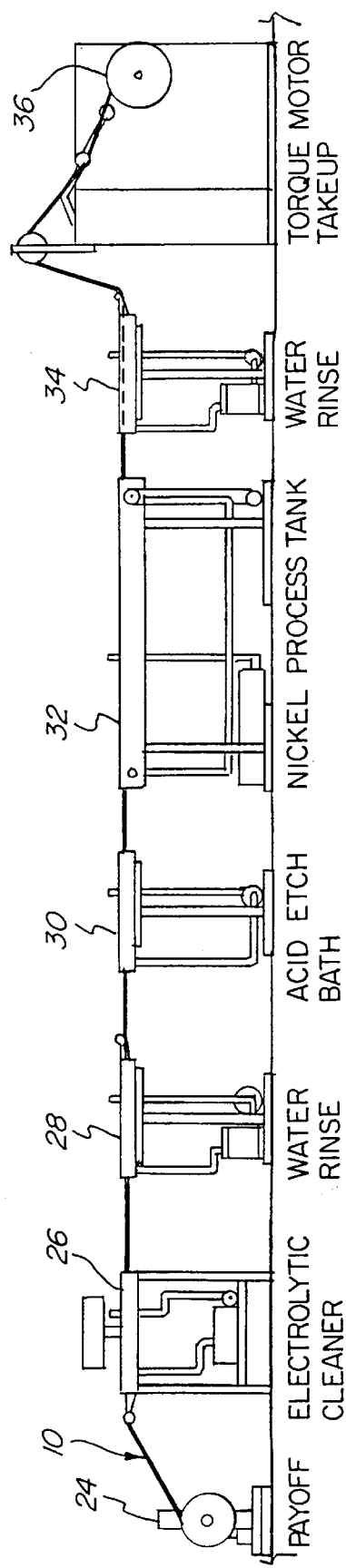
FIG. 6 is a schematic view of a nickel plating assembly line utilized in the fabrication of the strands of the superconductor cable embodying the present invention.

Turning now to FIG. 6, there is shown a nickel plating assembly line for plating the strands 10 of the superconductor cable. The strand 10 is taken from a payoff spool 24 through an electrolytic cleaner bath 26, a water rinse tank 28 and an acid etch bath 30, in succession. The wire 10 is then passed through a nickel electroplating tank 32, rinsed in a water rinse tank 34, and coiled on the takeup spool 36.

As is generally practiced, the superconductor wire strand 10 is generally produced by initially cladding a rod of the superconductor alloy with a normally conducting metal such as copper and drawing the clad rod into small diameter rods of about 0.035–0.060 inch. These rods are chopped into lengths which are then placed within a tube of the normally conducting metal, and this is drawn to produce wire of about 0.010–0.050 inch in which filaments of the superconductor alloy are about 0.00008–0.002 inch in diameter.

Various apparatus may be employed for compacting and deforming the bundle of wires 10 into the rectangular cable 20, and a Turks head die assembly has proven highly satisfactory and has not substantially injured the integrity of the nickel coating on the strands. Suitable apparatus for forming the wire bundle and effecting the compaction is shown in Jesseman U.S. Pat. No. 4,473,716 granted Sep. 25, 1984. The bundle will have a polygonal cross section and is usually trapezoidal.

The preferred wire for use in the present invention is one comprised of niobium/titanium superconductor alloy in a copper matrix. The wire strands used to form the bundle should have a diameter of about 0.010–0.050 inch, and preferably about 0.0250–0.040 inch. The electroplated nickel coating should have a thickness of about 30–100 microinches, and preferably 4014 60 microinches.

Polyamide tape is often wrapped around the cable to produce the insulating coating.

Figure 5:
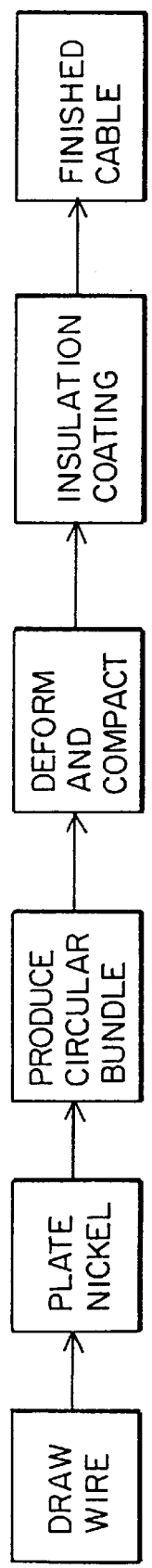
FIG. 5 is a block diagram of the several steps of the process for making the cable.

The several steps in the process of making the cable are shown diagrammatically in FIG. 5.

Illustrative of the efficacy of the present invention is the following example:

In the manner described above, a superconductor wire is provided with having filaments of an alloy of niobium and titanium in a copper matrix and having a diameter of 0.0318 inch. This is known as SSC inner type wire (OST), and is electroplated with nickel to provide a layer of approximately 50 microinches in thickness. Strands of this electroplated superconductor are then formed into 30 strand cable having a trapezoidal cross section and a sample length of approximately 50 feet (SSC 5 cm inner type conductor).

A first test conducted on this sample is a measurement of the critical current $I_c$ to determine if the nickel layer on the strands produced any adverse effects; the $I_c$ at 7 T and 4.22° K. is found to be 10,425 amperes. This compares favorably with other SSC 5 cm inner cables. Resistance measurements show no noticeable effect of the nickel coating on the resistance of the wire. At molding temperatures of 225° C., nickel diffusion into copper is negligible.

A second test is conducted on this sample to measure interstrand resistance using 10-stack molded samples cured at 225° C. for one hour at 10 kpsi loading. The fifth and sixth layers of the stack are measured. The interstrand resistance $R_I$ of the fifth layer is measured at 1170±440 microhms, and $R_I$ of the sixth layer is measured at 470±69 microhms. These values for the $R_I$ are quite high compared to cables without the nickel coating. For OST cables with uncoated wires, typical values under the same molding conditions are <1.0 microhms.

Test results in general have shown that the electrolytically deposited coating of pure nickel provides a consistent and stable $R_I$ between strands, ranging between 350 and 1,000 microhms depending upon the amount of heat and pressure to which the cable is subjected. The $R_I$ also appears to be ohmic with current flow through the conductor.

Thus, it can be seen from the foregoing detailed specification and attached drawings that the superconductor cable of the present invention provides high interstrand resistance which is consistent, stable and generally ohmic with the current flow through the conductor and this controls eddy current losses. The superconductor cable may also be fabricated readily and economically using known processes and may be cured at high temperatures and pressures.

Having thus described the invention, what is claimed is:

1. In a method for making superconductor cable, the steps comprising:

(a) encasing a multiplicity of filaments of a superconductor alloy in a normally conducting metal matrix to form superconductor wire;

(b) electroplating with nickel said superconductor wire to provide a nickel coating about the periphery thereof;

(c) forming an elongated bundle of generally circular cross section from a multiplicity of strands of said electroplated superconductor wire; and (d) deforming and compacting said bundle of strands into a superconductor cable of generally polygonal cross section, said nickel coating on said strands substantially maintaining its integrity in said cable, and said strands exhibiting only negligible diffusion of nickel into the matrix metal of said superconductor wire, said cable exhibiting relatively high interstrand resistance.

2. The method for making a superconductor cable in accordance with claim 1 wherein said metal of said matrix is copper.

3. The method for making a superconductor cable in accordance with claim 2 wherein there is included the initial steps of cladding rods of said superconductor alloy with copper, drawing said clad rods to a reduced diameter, placing multiple lengths of said drawn rods in a copper tube, and drawing said tube containing the rods into said superconductor wire.

4. The method for making a superconductor cable in accordance with claim 1 wherein the thickness of said coating of nickel is about 40–60 microinches.

5. The method for making a superconductor cable in accordance with claim 1 wherein the electroplating step includes the steps of:

(a) passing said wire through a cleaning solution;

(b) rinsing the cleaning solution from said wire;

(c) passing the cleaned and rinsed wire through an acid etching bath;

(d) passing the etched wire through a nickel electroplating bath; and (e) rinsing the nickel electroplated wire.

6. The method for making a superconductor cable in accordance with claim 1 wherein said deformation step is effected by passing said bundle through a die assembly to effect compaction and deformation of the wire strands while substantially maintaining the integrity of the nickel coating on said strands.

7. The method for making a superconductor cable in accordance with claim 1 wherein said superconductor alloy is a niobium/titanium alloy.

* * * * *